United States Patent
Wilson

Patent Number: 5,121,173
Date of Patent: Jun. 9, 1992

[54] PROXIMITY EFFECT VERY LONG WAVLENGTH INFRARED (VLWIR) RADIATION DETECTOR

[75] Inventor: Jerry A. Wilson, Goleta, Calif.

[73] Assignee: Santa Barbara Research Center, Goleta, Calif.

[21] Appl. No.: 377,698

[22] Filed: Jul. 10, 1989

[51] Int. Cl.$^5$ .................. H01L 39/22; H01L 31/12; H01B 12/00
[52] U.S. Cl. ........................................ 357/5; 357/19; 505/1; 505/702
[58] Field of Search ................ 357/5, 19; 505/848, 505/849, 874, 873, 1

[56] References Cited

FOREIGN PATENT DOCUMENTS

| 0314484A2 | 5/1989 | European Pat. Off. ............. 357/5 |
| 58-141582 | 8/1983 | Japan ............................ 357/5 |
| 60-65581 | 4/1985 | Japan .......................... 505/874 |
| 63-31180 | 2/1988 | Japan ............................ 357/5 |
| 1-121784 | 5/1989 | Japan .......................... 505/873 |

OTHER PUBLICATIONS

"n-InAs/GaAs Heterostructure Superconducting Weak Links with Nb Electrodes", Kleinsasser et al., Appl. Phys. Lett., vol. 49, #25, Dec. 22, 1986, pp. 1741-1743.
"New 120K Tl-Ca-Ba-Cu-O Superconductor", Sheng et al., Appl. Phys. Lett., vol. 52, #20, May 16, 1988, pp. 1738-1740.
"Bi-Sr-Ca-Cu-O Superconductor System with Critical Temperatures of 80 and 107K", Kugimiya et al., Appl. Phys. Lett., vol. 52, #22, May 30, 1988, pp. 1895-1896.
"Interdiffusion and Interfacial Reaction Between an YBa$_2$Cu$_3$O$_x$ Thin Film and Substrates", Nakijima et al., Appl. Phys. Lett., vol. 53, #15, Oct. 10, 1988, pp. 1437-1439.
"High-Temperature Superconductivity in Y-Ba-Cu-O: Identification of a Copper-Rich Superconducting Phase", Stacy et al., J. Am. Chem. Soc., vol. 109, 1987, pp. 2528-2530.

*Primary Examiner*—Rolf Hille
*Assistant Examiner*—Mahshid Saadat
*Attorney, Agent, or Firm*—W. C. Schubert; W. K. Denson-Low

[57] ABSTRACT

A VLWIR proximity effect detector 10 includes a substrate 12, a bulk superconducting material 14, a proximity layer 16 which overlies a portion of the bulk superconducting material 14, an insulator layer 17 and a transparent tunnelling electrode 18. Detector electrical contacts 19 are provided on the proximity layer 16 and on the electrode 18. VLWIR, indicated by the arrows, is absorbed in proximity layer 16 and causes a detectable modulation of tunnelling characteristics (current or voltage) between the proximity layer 16 and the electrode 18. The proximity layer has a thickness on the order of a coherence length for the material which comprises the proximity layer. In accordance with the invention it has been determined that a spatially varying energy gap ($E_{gap}$) induced in the proximity layer by the adjacent superconducting material results in the proximity layer having a longer cut off wavelength than that of the adjacent bulk superconducting material. The lower value of the induced $E_{gap}$ within the proximity layer results in Cooper pair breaking with photons of lower energy, or longer wavelength, than is possible in the bulk superconducting material.

16 Claims, 1 Drawing Sheet

PROXIMITY EFFECT VERY LONG WAVLENGTH INFRARED (VLWIR) RADIATION DETECTOR

FIELD OF THE INVENTION

This invention relates generally to radiation detectors and, in particular, to a nonequilibrium superconducting infrared (IR) radiation detector having a proximity layer for extending the spectral sensitivity of the detector to wavelengths longer than the cutoff wavelength of the superconducting material.

BACKGROUND OF THE INVENTION

A desirable goal in the design and fabrication of IR radiation detectors is an extension of the detector spectral sensitivity to wavelengths longer than approximately 3 microns.

One type of IR detector which accomplishes this upper wavelength extension is known as a superconducting heterodyne mixer. This type of detector can be fabricated to exhibit an upper cut off wavelength of approximately 100 microns, which is within a range of wavelengths considered as Very Long Wavelength IR (VLWIR) radiation. However, this type of detector is known to be wavelength selective and to absorb only a single spectral line at such longer wavelengths. Furthermore, for use at longer wavelengths this type of detector is not readily adaptable to fabrication with a fine geometry required to produce a relatively large and compact array of detectors.

It is therefore one object of the invention to provide a radiation detector which absorbs a significantly broad range of wavelengths of VLWIR.

It is another object of the invention to extend the spectral sensitivity of nonequilibrium superconducting detectors.

It is another object of the invention to provide a superconducting radiation detector having an improved surface morphology which facilitates the fabrication of multilayer Superconducting-Insulating-Superconducting (SIS) and Superconducting-Insulating-Normal (SIN) type junctions.

It is one further object of the invention to extend the spectral sensitivity of nonequilibrium High Temperature Superconducting (HTS) detectors by providing a proximity layer on a surface of the HTS material, the proximity layer exhibiting a smaller, induced, energy gap than the adjacent HTS material and a correspondingly longer cutoff wavelength.

SUMMARY OF THE INVENTION

The foregoing problems are overcome and other advantages are realized by a VLWIR radiation proximity effect detector that includes a bulk superconducting material, a proximity layer that overlies a portion of the bulk superconducting material, an insulator layer and a transparent tunnelling electrode. VLWIR radiation is absorbed in the proximity layer and causes a detectable modulation of tunnelling current between the proximity layer and the electrode. The proximity layer has a thickness on the order of a coherence length for the material that comprises the proximity layer. In accordance with the invention it has been determined that a spatially varying energy gap ($E_{gap}$) induced in the proximity layer by the adjacent superconducting material results in the proximity layer having a longer cut off wavelength than that of the adjacent bulk superconducting material. The lower value of the induced $E_{gap}$ within the proximity layer results in Cooper pair breaking with photons of lower energy, or longer wavelength, than is possible in the bulk superconducting material.

BRIEF DESCRIPTION OF THE DRAWING

The above set forth and other features of the invention are made more apparent in the ensuing Detailed Description of the Invention when read in conjunction with the attached Drawing, wherein.

DETAILED DESCRIPTION OF THE INVENTION

Figure 1:
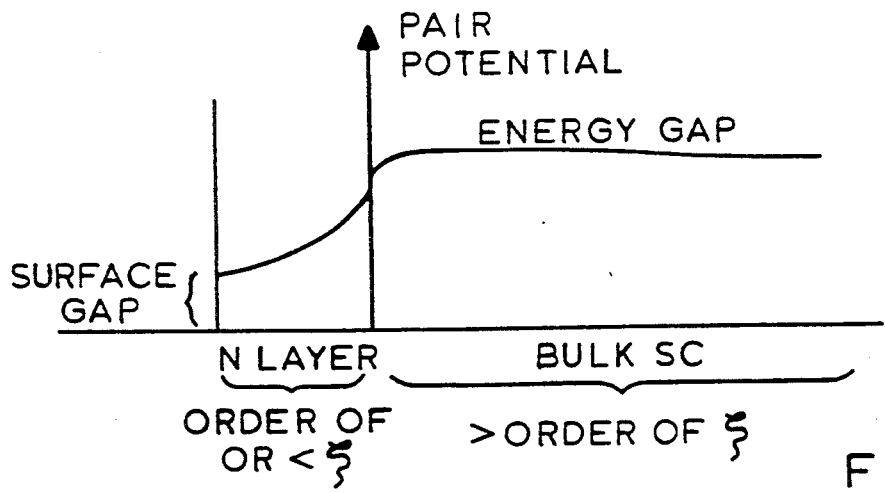
FIG. 1 is a graph which illustrates the size of the induced proximity layer surface energy gap as compared to the size of the energy gap of the underlying bulk HTS material.

A non-superconducting (normal) metal or a superconducting metal or ceramic material operated above its critical temperature ($T_c$) becomes superconducting when a thin layer of the material, having a thickness on the order of a coherence length ($\xi_N$) of the material, is coated onto a bulk superconducting material which is operating below its $T_c$ and which has a thickness substantially larger than its coherence length ($\xi$). The thin coating layer is referred to in the art as a proximity layer. The energy gap ($E_{gap}$) of the proximity layer is equal to twice the value of the pair potential. As can be seen in the graph of FIG. 1 the pair potential induced in the proximity layer by the adjacent superconducting material is less than that of the adjacent bulk superconductor and varies spatially such that the magnitude of $E_{gap}$ at a surface of the proximity layer can be made arbitrarily small by increasing the thickness of the proximity layer.

In accordance with the invention it has been determined that the smaller magnitude of the induced $E_{gap}$ at the surface results in the proximity layer having a longer radiation cut off wavelength than that of the adjacent bulk superconducting material. That is, the lower value of the induced $E_{gap}$ within the proximity layer results in Cooper pair breaking with photons of lower energy, or longer wavelength, than is possible in the bulk superconducting material. This property is exploited by the radiation detector of the invention in a manner as disclosed below.

Figure 2:
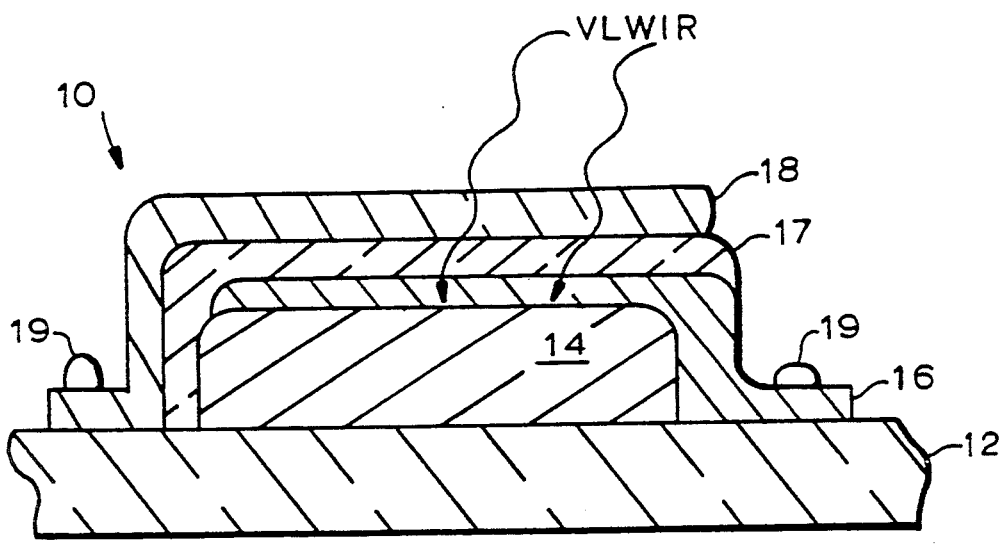
FIG. 2 is cross-sectional view, not to scale, of a HTS VLWIR radiation detector having a proximity layer disposed over a surface of the HTS material.

Referring to FIG. 2 there is shown, in accordance with one embodiment of the invention, a cross-sectional view of a VLWIR proximity effect detector 10. Detector 10 includes a substrate 12, a bulk superconducting material 14, a proximity layer 16 that overlies a portion of the bulk superconducting material 14, an insulator layer 17 and a transparent tunnelling electrode 18. Detector electrical contacts 19 are provided on the proximity layer 16 and on the electrode 18. VLWIR radiation, indicated by the arrows, is absorbed in proximity layer 16 and causes a modulation of tunnelling current between the proximity layer 16 and the electrode 18. It should be realized that the single detector 10 shown in FIG. 2 may be one of a plurality of detectors organized as an array of detectors. It should also be realized that during operation the detector 10 is maintained at a temperature lower than the critical temperature for the superconducting material 14.

In a presently preferred embodiment of the invention the bulk superconducting material 14 is comprised of HTS material such as YBaCuO, BiSrCaCuO or TlCaBaCuO. The bulk superconducting material 14 has a thickness that is several times greater than the coherence length of the material, typically approximately five times greater. For example, if the material 14 is comprised of lead the thickness is within a range of approximately 4000 angstroms to approximately 5000 angstroms. The substrate 12 is comprised of a suitable HTS substrate material such as MgO. The proximity layer 16 may be comprised of, by example, Nb, NbN, NbTi, Pb, a ceramic HTS material operated above its critical temperature, or of a metal which has no nonzero critical temperature such as Cu or Ag. As was previously stated, the thickness of the proximity layer 16 is a function of the coherence length of the selected proximity layer material and also the desired minimum value of $E_{gap}$ within the proximity layer 16. The insulator layer 17 has a thickness substantially equal to a required tunnelling thickness and may be approximately 10 angstroms to approximately 30 angstroms thick if comprised of, for example, $Al_2O_3$. The transparent tunnelling electrode 18 may be comprised of either superconducting or of normal material.

The proximity layer 16 preferably has a thickness on the order of the coherence length; that is, a thickness within an order of magnitude of the coherence length. For example, for a thickness value of approximately one to three coherence lengths the value of $E_{gap}$ at the surface remains within a reasonable range of values. As the thickness approaches an order of magnitude (10×) greater than the coherence length the magnitude of $E_{gap}$ asymptotically approaches zero, resulting in unstable or undefined device behavior. For a thickness value that is significantly less than one coherence length the effect of reducing the magnitude of $E_{gap}$ is reduced such that a significant enhancement in longer wavelength responsivity is not achieved.

In that the coherence length of the proximity layer 16 is determined by the material of the proximity layer and not by that of the underlying bulk superconductor 14 a more readily fabricated device results. That is, a problem associated with the extremely short coherence length, approximately 4 angstroms, of HTS materials such as YBaCuO, BiSrCaCnO and TlCaBaCuO is avoided thereby enabling the deposition of thicker layers of material.

The proximity layer has a coherence length ($\xi_N$) determined only by the material of the proximity layer in accordance with the expression $$\xi_N = 0.18 (\hbar v_f)/(k_B(T - TC_N)), \text{ where } T > Tc_N. \quad (1)$$

Assuming that the proximity layer 16 is not a superconductor at any temperature, that is the critical temperature $Tc_N = 0$, then $v_f$ = the Fermi velocity, $\hbar$ = Planck's constant, $k_B$ = Boltzmann's constant and T is temperature. By example, and in accordance with equation (1) set forth above, a proximity layer comprised of Cu can be shown to have a coherence length of approximately $10^2$ angstroms.

Figure 3:
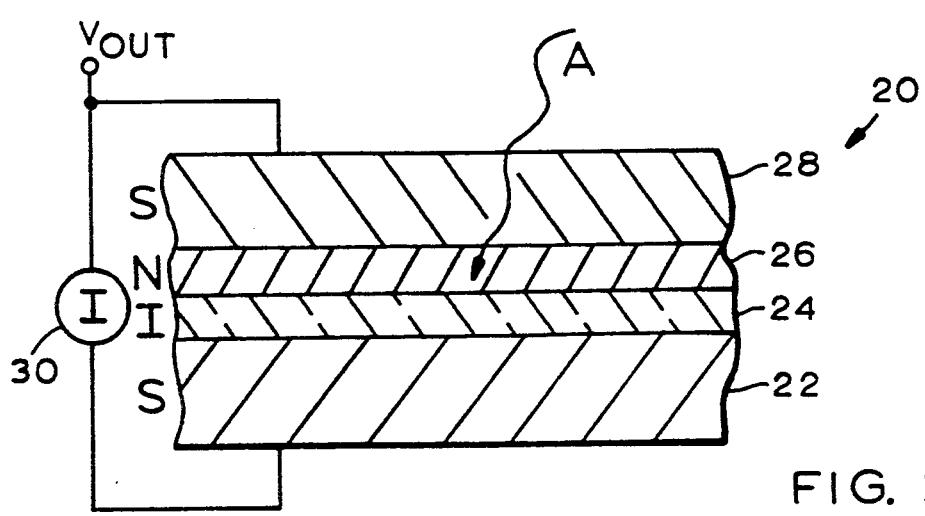
FIG. 3 is a cross-sectional view of a SINS proximity effect VLWIR radiation detector having a radiation absorbing layer (N) which is induced to operate as a superconductor by the adjacent superconducting material.

The teaching of the invention also facilitates the fabrication of multilayer Superconducting-Insulating-Superconducting (SIS) and Superconducting-Insulating-Normal (SIN) type junctions. As can be seen in FIG. 3 there is shown a SIS type device which is modified to include a normal proximity layer, thereby providing a SINS type detector device 20. Device 20 includes a superconducting (S) layer 22, an insulating (I) layer 24, a normal (N) proximity layer 26 and a superconducting (S) layer 28. VLWIR, indicated by the arrow A, passes unabsorbed through the higher $E_{gap}$ and shorter cut off wavelength superconducting layer 28 and is absorbed within the normal proximity layer 26. As before, the thickness of the proximity layer 26 is a function of the coherence length of the material. By example, if the proximity layer 26 is comprised of Cu having a $\xi_N$ of approximately $10^2$ angstroms then the thickness of the layer 26 may have a comparable dimension. The insulating layer 24 is on the order of a tunnelling thickness, or approximately 10 to approximately 30 angstroms. The insulating layer 24 is preferably comprised of a material suitable for forming a hard layer having a substantially uniform thickness of approximately 30 angstroms or less. $Al_2O_3$ and MgO are two suitable materials.

In operation a constant current source 30 is coupled between the two superconducting layers and a voltage output ($V_{out}$) is monitored. The voltage output varies in response to VLWIR radiation which is absorbed within the proximity layer 26, the absorbed radiation breaking Cooper pairs which results in a modulation of the potential drop across the insulating layer 24. It may also be operated with a constant voltage source, where in VLWIR photon induced pair breaking results in a modulation of the current which tunnels through the insulating layer 24 to the superconducting layer 22. The radiation may be incident on either of the superconducting layers 22 or 28 in that both layers, due to their higher value of $E_{gap}$, are substantially transparent to VLWIR. The relatively thin insulating layer 24 is also substantially transparent to VLWIR.

It is noted that the devices illustrated in FIGS. 2 and 3 are amenable to fabrication by known types of semiconductor photolithographic processing methodolgy.

While the invention has been particularly shown and described with respect to a preferred embodiment thereof, it will be understood by those skilled in the art that changes in form and details may be made therein without departing from the scope and spirit of the invention.

What is claimed is:

1. A radiation detector including a body comprised of material that is superconducting below a critical temperature, said body having a radiation absorbing layer disposed upon a surface thereof, said radiation absorbing layer having a thickness which is a function of a coherence length of a material which comprises said radiation absorbing layer for having an energy gap induced therein by said body of superconducting material, wherein the induced energy gap has a spatially varying magnitude which decreased in magnitude as a function of distance from said body of superconducting material, and wherein said radiation absorbing layer has a longer cut off wavelength than said body of superconducting material.

2. A radiation detector as set forth in claim 1 wherein said body of superconducting material is comprised of high temperature superconducting (HTS) material.

3. A radiation detector as set forth in claim 2 wherein said body of superconducting material is comprised of YBaCuO, BiSrCaCuO or TlCaBaCuO.

4. A radiation detector as set forth in claim 1 wherein said radiation absorbing layer is comprised of Nb, NbN, NbTi, Pb, a ceramic HTS material operated above its critical temperature, a metal having no nonzero critical temperature or combinations thereof.

5. A VLWIR proximity effect detector comprising:
a substrate;
a bulk superconducting material disposed upon said substrate;
a proximity layer overlying at least a portion of said bulk superconducting material and in contact therewith, said proximity layer having a thickness of an order of a coherence length of a material which comprises said proximity layer for having induced therein an energy gap having a spatially varying magnitude which decreases in magnitude as a function of distance from said bulk superconducting material, the thickness of said proximity layer being selected such that the spatially varying energy gap induced therein has a value for providing said proximity layer with a cut off wavelength characteristic for absorbing radiation having wavelengths longer than approximately 30 microns;
an electrical insulator disposed upon at least a portion of said proximity layer; and
a transparent tunnelling electrode overlying said proximity layer and electrically insulated therefrom by intervening portions of said electrical insulator.

6. A detector as set forth in claim 5 wherein said bulk superconducting material is comprised of high temperature superconducting (HTS) material.

7. A detector as set forth in claim 5 wherein said bulk superconducting material is comprised of YBaCuO, BiSrCaCuO or TlCaBaCuO.

8. A detector as set forth in claim 7 wherein said proximity layer is comprised of Nb, NbN, NbTi, Pb, a ceramic HTS material operated above its critical temperature, a metal having no nonzero critical temperature or combinations thereof.

9. A detector as set forth in claim 5 wherein said electrode is comprised of high temperature superconducting (HTS) material.

10. A detector as set forth in claim 5 and further comprising a plurality of electrical contacts coupled to said detector for coupling said detector to readout means.

11. A detector as set forth in claim 10 wherein said readout means comprises a constant current, or constant voltage generating means.

12. A SINS IR radiation detector comprising:
a first layer comprised of a superconducting material;
a second layer comprised of an electrically insulating material overlying said first layer;
a third layer comprised of a normal material overlying said second layer; and
a fourth layer comprised of a superconducting material overlying said third layer; wherein
said third layer has a thickness of an order of a coherence length of the normal material that comprises said third layer for having induced therein an energy gap having a spatially varying magnitude which decreases in magnitude as a function of distance from said fourth layer, the thickness of said third layer being selected such that the spatially varying magnitude of the energy gap induced therein has a value for providing said third layer with a cut off wavelength characteristic for absorbing radiation having wavelengths longer than a cut off wavelength of said fourth layer for producing a detectable electrical signal.

13. A SINS IR radiation detector as set forth in claim 12 and further comprising means for conductively coupling said first and said fourth layers to an electrical signal readout means.

14. A SINR IR radiation detector as set forth in claim 12 wherein said first and said fourth layer of superconducting material are comprised of YBaCuO, BiSrCaCuO or TlCaBaCuO.

15. A SINS IR radiation detector as set forth in claim 12 wherein said third layer is comprised of a material having no nonzero critical temperature.

16. A SINS IR radiation detector as set forth in claim 14 wherein said second layer is comprised of $Al_2O_3$, MgO or combinations thereof.

* * * * *

UNITED STATES PATENT AND TRADEMARK OFFICE
CERTIFICATE OF CORRECTION

PATENT NO. : 5,121,173
DATED : Jun. 9, 1992
INVENTOR(S) : Jerry A. Wilson, Goleta, Calif.

It is certified that error appears in the above-identified patent and that said Letters Patent is hereby corrected as shown below:

Title page, item [54] and col. 1, in the title should read:

PROXIMITY EFFECT VERY LONG

WAVELENGTH INFRARED (VLWIR)

RADIATION DETECTOR

Signed and Sealed this

Fourteenth Day of September, 1993

*Attest:*

BRUCE LEHMAN

*Attesting Officer*  *Commissioner of Patents and Trademarks*